United States Patent [19]
Overall et al.

[11] 3,986,110
[45] Oct. 12, 1976

[54] WATER DEPTH MEASURING DEVICE
[75] Inventors: Wilson W. Overall, Warson Woods; Jerry R. Waldman, Manchester, both of Mo.
[73] Assignee: Surface Systems, Inc., St. Louis, Mo.
[22] Filed: Aug. 29, 1975
[21] Appl. No.: 609,019

[52] U.S. Cl. .............................. 324/61 R; 324/61 P; 324/65 R; 340/235
[51] Int. Cl.² ........................................ G01R 27/26
[58] Field of Search .............. 324/61 R, 61 P, 65 R, 324/57 R; 73/304 C; 317/246; 328/4; 340/235

[56] References Cited
UNITED STATES PATENTS
3,873,927  3/1975  Overall et al. ................. 324/61 R X
3,882,381  5/1975  Gregory ........................... 324/61 R Primary Examiner—Stanley T. Krawczewicz
Attorney, Agent, or Firm—Koenig, Senniger, Powers and Leavitt

[57] ABSTRACT
A device for use in determining the depth of water accumulating on the surface of a pathway, such as an airport runway or the like. A block of electrically insulative material is embedded in a pathway with the top surface of the block being substantially flush with the pathway surface and exposed to atmospheric precipitation. A sensor comprising first and second capacitors, each of which has first and second coplanar spaced apart electrodes, is positioned within the block with the electrodes of the first capacitor positioned adjacent to and inclined with respect to the top surface of the block and with the electrodes of the second capacitor being positioned a substantially greater distance from the top surface of the block whereby an accumulation of water on the surface of the block affects the dielectric, capacitance and conductance of the first capacitor without substantially affecting the dielectric, capacitance and conductance of the second. Time-varying out-of-phase electrical signals are applied to the first electrodes of the capacitors as the input to the sensor. An output circuit commonly connected to the second electrodes of the aforesaid capacitors supplies an electrical output signal relative to electrical ground from the sensor. At least one electrical conductor within the block is connected to electrical ground with a portion thereof exposed to the atmosphere at the top surface of the block. Accumulation of water on the surface of the block affects the capacitance and conductance between the output circuit and electrical ground whereby the amplitude of the electrical output signal of the sensor is a function of the depth of water accumulating on the surface of the pathway.

15 Claims, 5 Drawing Figures

WATER DEPTH MEASURING DEVICE

BACKGROUND OF THE INVENTION

This invention relates to measurement devices and more particularly to a device for use in measuring water depth on the surface of a pathway, such as an airport runway or the like.

Easily ascertainable and accurate knowledge of the depth of water accumulating on the surface of an airport runway is very useful and in some situations a necessity. At airports, for example, decisions, during a rainstorm, as to which runways are safe to use and which are not, affect hundreds of lives. The ability of the airport operations manager to discern, at a glance, on which runways or portions thereof the danger of hydroplaning exists enables him to determine which runways to close and which to continue in use.

To be effective, a water depth measuring system must employ a sensing device which is easily installed at remote locations and which is capable of withstanding the constant passage of airplanes and vehicles. Further, the device must be capable of developing accurate information. In coassigned U.S. Pat. No. 3,882,381 and 3,873,927 sensors and a system are disclosed for reliably determining and indicating when water or ice are present on the surface of an airport runway or highway. However, these sensors and the systems of these patents were not intended for nor do they provide reliable water depth sensing and indication.

SUMMARY OF THE INVENTION

Among the several objects of the invention may be noted the provision of a device which reliably and accurately determines the depth of water accumulating on the surface of pathways such as an airport runway; the provision of such a sevice which is easily embedded in the surface of a pathway for exposure of the device to atmospheric precipitation; the provision of such a device which is rugged in use; the provision of such a device for providing a monotonic output signal for a preselected range of water depth; the provision of such a device in which erroneous water depth indications are avoided by precluding any water depth indications if water on the surface of the pathway contains contaminants; and the provision of such a device which is high in sensitivity and reliability, low in cost and compact in size.

Briefly, a device for use in determining the depth of water accumulating on the surface of a pathway, such as an airport runway or the like, comprises a block of electrically insulative material embedded in a pathway with the top surface of the block being substantially flush with the pathway surface and exposed to atmospheric precipitation. A sensor comprising first and second capacitors each of which has first and second coplanar spaced apart electrodes, is positioned within the block with the electrodes of the first capacitor positioned adjacent to and inclined with respect to the top surface of the block and with the electrodes of the second capacitor being positioned a substantially greater distance from the top surface of the block whereby an accumulation of water on the surface of the block affects the dielectric, capacitance and conductance of the first capacitor without substantially affecting the dielectric, capacitance and conductance of the second. Means are provided for applying time-varying out-of-phase electrical signals to the first electrodes of the aforesaid capacitors as the input to the sensor. Output means are commonly connected to the second electrodes of the aforesaid capacitors for supplying an electrical output signal relative to electrical ground from the sensor. At least one electrical conductor within the block is connected to electrical ground with a portion thereof exposed to atmospheric precipitation at the top surface of the block. Accumulation of water on the surface of the block affects te capacitance and conductance between the output means and electrical ground whereby the amplitude of the electrical output signal of the sensor is a function of the depth of water accumulating on the surface of the pathway.

Other objects and features will be in part apparent and in part pointed out hereinafter.

BRIEF DESCRIPTION OF THE DRAWINGS

Corresponding reference characters indicate correponding parts throughout the several views of the drawings.

DESCRIPTION OF A PREFERRED EMBODIMENT

Figure 1:
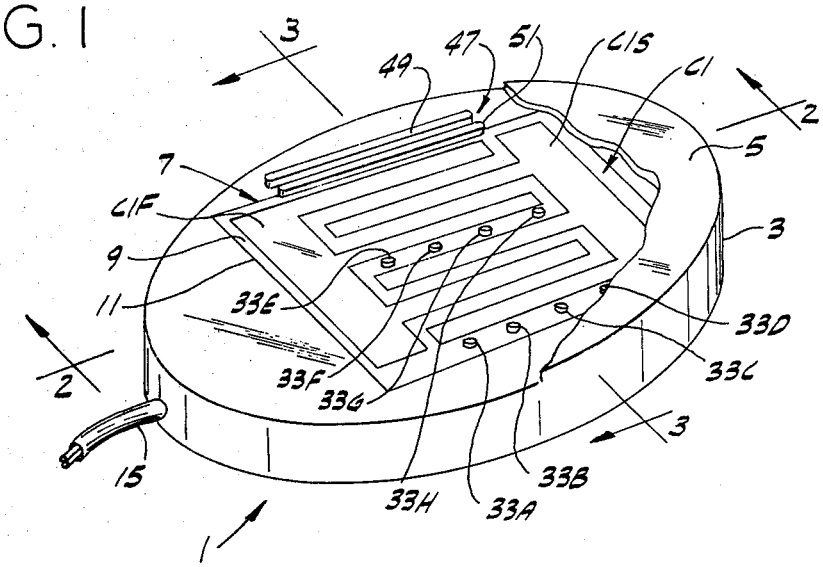
FIG. 1 is a perspective of a device of the present invention.

Referring now to the drawings, a device for use in determining the depth of water accumulating on the surface of a pathway, such as an airport runway or the like, is generally indicated at 1. Device 1 has a block 3 of electrically insulative material which is embedded in the pathway so that top surface 5 of block 3 is substantially flush with the surface of the pathway and exposed to atmospheric precipitation. The material used in forming block 3 is preferably a synthetic resin material, such as an epoxy or the like, and is dark colored.

A sensor 7 comprising first and second capacitors C1 and C2 is positioned within block 3. Capacitor C1 has coplanar, spaced apart, interdigitated copper electrodes C1F and C1S which are etched on the top surface 9 of an electrically insulative substrate or printed circuit board 11. Capacitor C2 also has coplanar, spaced apart interdigitated copper electrodes C2F and C2S which are etched on the opposite or bottom surface 13 of printed circuit board 11. Electrodes C2F and C2S of capacitor C2 are positioned on bottom surface 13 of board 11 so as to be parallel to and in registry with electrodes C1F and C1S of capacitor C1.

Figure 2:
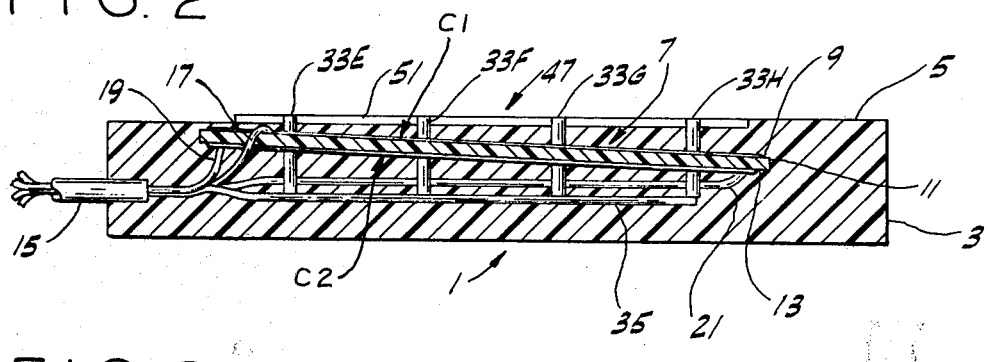
FIG. 2 is a sectional view of the device of FIG. 1 on line —2.

Sensor 7 is positioned in block 3 with electrodes C1F and C1S of capacitor C1 adjacent to and inclined with respect to top surface 5 of block 3. More specifically, sensor 7 is so inclined with respect to top surface 5 of block 3 that electrode C1F of capacitor C1 is nearer top surface 5 of block 3 than is electrode C1S. Thus, electrodes C2F and C2S of capacitor C2 are positioned a greater distance from top surface 5 of block 3. As shown in FIG. 2, printed circuit board 11 is encapsulated in block 3 with one end of top surface 9 of board 11 nearer top surface 5 of block 3 than the other end.

As a consequence, accumulation of water on top surface 5 of block 3 affects the dielectric, capacitance and conductance of capacitor C1 without substantially affecting the dielectric, capacitance and conductance of capacitor C2.

Device 1, when embedded in a pathway surface, is interconnected to a remote monitoring station through a cable 15. Cable 15 has a plurality of shield electrical conductors three of which (17, 19 and 21) are shown in FIG. 2. The shielding of these conductors is connected to electrical ground at a convenient location preferably at the monitoring station. Conductor 17 is connected to electrode C1F of capacitor C1, and conductor 19 is connected to electrode C2F of capacitor C2. Conductor 21 is connected between an output of device 1 and an amplifier A1, which may be located at the remote monitoring station.

Figure 4:
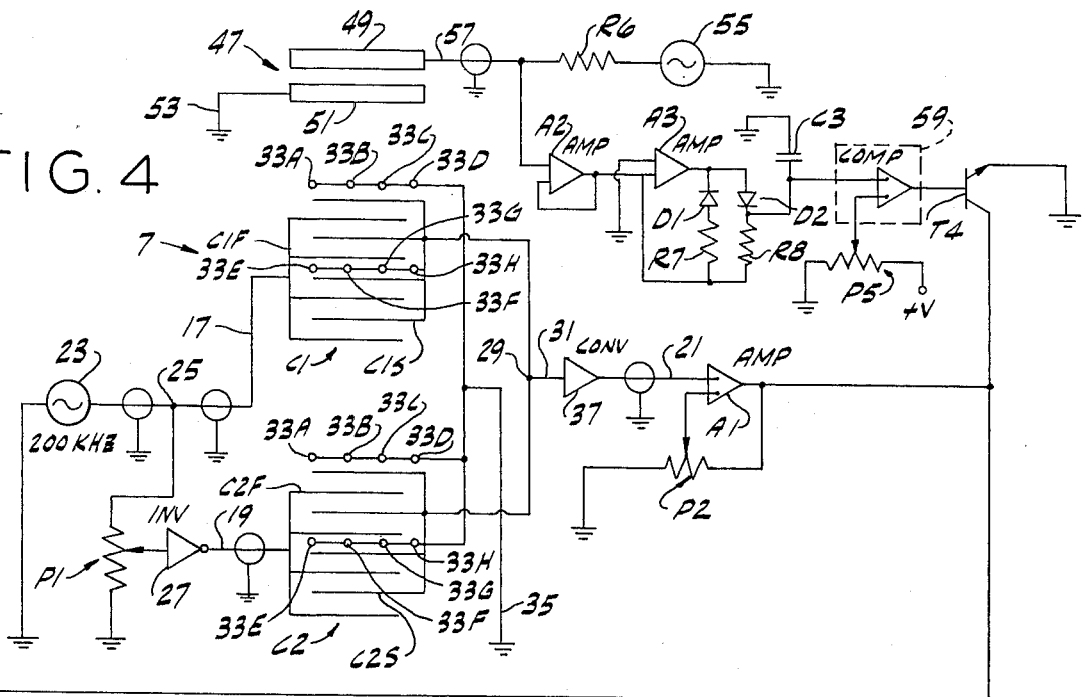
FIG. 4 is a schematic diagram of a system for measuring water depth using the device of the present invention.

Referring to FIG. 4, a signal generator 23 having, for example, a 200 KHZ frequency output is connected between electrical ground and a junction point 25. Signal generator 23 is a conventional signal generator having the usual gain control to vary the amplitude of its output signal. A time-varying electrical signal from generator 23 is supplied, via conductor 17, to electrode C1F of capacitor C1. This signal is also inverted by an inverter 27 and supplied, via conductor 19, to electrode C2F of capacitor C2. A potentiometer P1 is provided at the input to inverter 27 to adjust the amplitude of the 180° out-of-phase signal applied to electrode C2F for reasons to be discussed. The out-of-phase, time-varying electrical signals thus applied to electrodes C1F and C2F are the input to sensor 7.

Electrode C1S of capacitor C1 and electrode C2S of capacitor C2 are commonly connected at a junction point 29 as shown in FIG. 4. A time-varying electrical signal developed at junction point 29 is supplied on conductor 31 as the electrical output signal of sensor 7, the amplitude of this signal being relative to electrical ground. The common connection between the second electrodes of capacitors C1 and C2 is obtained by drilling a hole through printed circuit board 11 and inserting through this hole an electrical conductor which is soldered to the second electrode of each capacitor. As shown in FIG. 1, an electrical conductor 33A is positioned within block 3 of electrically insulative material. Conductor 33A, which is preferably a metallic pin, is connected to electrical ground by a grounding wire 35, and a portion of conductor 33A is exposed to atmospheric precipitation at top surface 5 of block 3. The presence of conductor 33A creates a capacitance and a conductance effect between the output of sensor 7 and electrical ground. This shunting effect is analogous to placing, in parallel, a variable capacitance and a variable resistance between junction point 29, the output of sensor 7, and electrical ground.

Figure 3:
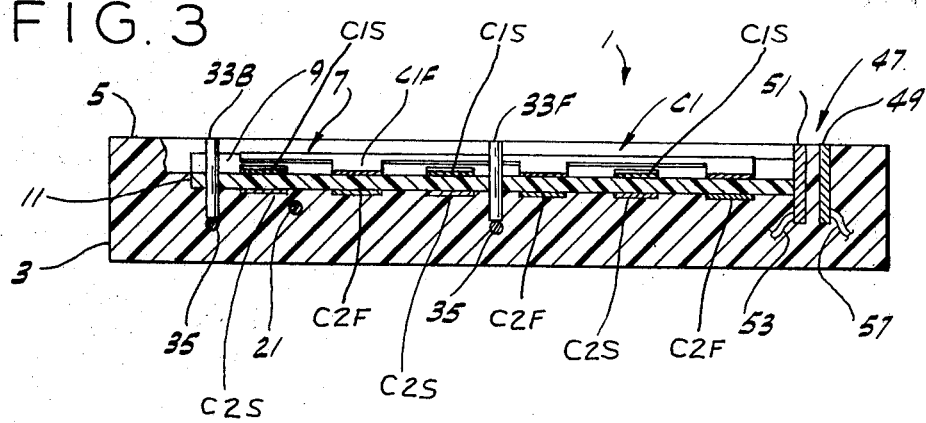
FIG. 3 is a sectional view of the device of FIG. 1 on line 3—3.

Additional electrical conductors 33B through 33H are positioned within block 3 to enhance the coupling and conductance effects between junction point 29 and electrical ground. Each of these conductors is connected to electrical ground by grounding wire 35. Further, each has a portion exposed to the atmosphere at top surface 5 of block 3. As shown in FIGS. 1 and 3, the exposed portion of electrical conductors 33B through 33H are laterally spaced from and positioned about sensor 7. Preferably, a portion of the electrical conductors, 33E through 33H, are positioned between the first and second interdigitated electrodes of capacitor C1 and are insulated from the electrodes by the insulative material of printed circuit board 11. Since all electrical conductors extend through printed circuit board 11, as shown in FIGS. 2 and 3, conductors 33E through 33H are also positioned between the first and second interdigitated electrodes of capacitor C2 and are similarly insulated. The inclusion of electrical conductors 33A through 33H in block 3, along with the inclination of sensor 7 with respect to top surface 5 of block 3, results in the output voltage of sensor 7 having a monotonic relationship with the depth of water accumulating on the surface of the pathway over a preselected range of water depth.

Figure 5:
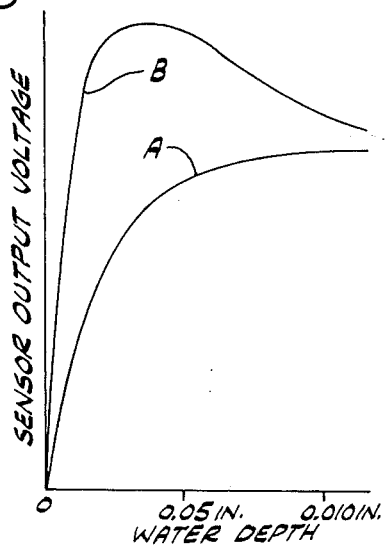
FIG. 5 is a graph illustrating the voltage output of a device of the present invention versus water depth both before and after the inclination of the first sensor and the addition of the grounding pins.

Referring to FIG. 5, curve A represents the relationship between the output voltage of sensor 7 and the depth of water accumulating on the surface of the pathway. For a range of water depth of zero to 0.10 inches, curve A is single valued or monotonic; that is, a single value of output voltage obtained from sensor 7 represents only one water depth. curve B represnets the relationship between water depth and the output voltage of a sensor disclosed in coassigned U.S. Nos. 3,882,381 and 3,873,927 which does not include electrical conductors 33A through 33H nor the inclination of the sensor with respect to the top surface of the block. For the range of water depth plotted in FIG. 5, curve B is bivalued and therefore not monotonic; that is, for a portion of the range of water depth shown, one output voltage value obtained from the prior disclosed sensor can represent more than one water depth.

Device 1 is useful in a system for warning when hydroplaning conditions are present on the surface of a runway. To provide such warnings, the electrical output signal from sensor 7 is converted to a d.c. voltage. When the d.c. voltage amplitude exceeds a predetermined level, a signal is supplied to illuminate a warning light signifying the presence of dangerous conditions.

The electrical input signal supplied to electrode C1F of capacitor C1, in the manner previously discussed, is coupled to electrode C1S. Similarly, the 180° out-of-phase electrical input signal supplied to electrode C2F of capacitor C2 is coupled to electrode C2S. Since electrodes C1S and C2S are commonly connected, a signal is developed at the output of sensor 7, junction point 29, which is a composite of the electrical signals coupled between the first and second electrodes of the respective capacitors. In the absence of precipitation, the amplitude of the signal developed at junction point 29 is zero. Because of the different thicknesses of electrically insulative material covering the electrodes of capacitors C1 and C2, as shown in FIG. 2, the capacitance of capacitor C1 differs only slighly from that of capacitor C2 and this effects the degree of coupling between the electrodes of the respective capacitors. In order, therefore, to obtain a zero amplitude output signal at junction point 29, under clear surface conditions, potentiometer P1 is adjusted to compensate for the effect of this minor difference in capacitance by adjusting the amplitude of the signal applied to electrode C2F.

When rainwater is present on top surface 5 of block 3, the dielectric, capacitance and conductance of capacitor C1 increases while that of capacitor C2 remains unaffected. The resultant electrical signal developed at junction point 29 no longer has zero amplitude but rather an amplitude which is a function of the depth of water accumulating on the runway surface. The electrical output signal from sensor 7 is supplied on line 31 to the input of an alternating-current to direct-current converter 37 which is preferably constructed on bottom surface 13 of printed circuit board 11. The output of converter 37 is a d.c. voltage the amplitude of which is representative of the depth of water accumulating on the surface of the runway. The d.c. voltage output of converter 37 is supplied, via shielded electrical conductor 21, to one input of amplifier A1. The gain of amplifier A1 is adjusted by the setting of a potentiometer P2 connected in the feedback loop of the amplifier.

The d.c. output voltage of amplifier A1 is supplied to a voltage divider network which includes resistors R1 and R2 and a potentiometer P3. Potentiometer P3 is adjusted so that the input voltage to a comparator 39 does not exceed a predetermined level until a predetermined depth of water, for example 0.05 inches, is present on the surface of the runway. When the predetermined depth of water has accumulated on the runway surface, the input voltage to comparator 39 exceeds the predetermined level, and the output of comparator 39 becomes a voltage which is supplied to the base of an NPN transistor T1 through a resistor R3. Transistor T1 is turned on, and a ground path is provided through signal lamp L1 and transistor T1 for a supply voltage +V. Signal lamp L1 is illuminated and a visual indication or warning is provided. Turn-on of transistor T1 also causes turn-on of a PNP transistor T2. If switch S1 is closed, turn-on of transistor T2 results in supply voltage +V being supplied to a buzzer or audio alarm circuit 41 and an audible alarm is provided along with the visual warning.

The d.c. output voltage from amplifier A1 is also supplied to a second voltage divider network including resistors R4 and R5 and a potentiomenter P4. Potentiometer P4 is adjusted so that the input voltage to a comparator 43 does not exceed a predetermined level until a second predetermined depth of water, for example 0.10 inches, is present on the surface of the runway. When the second predetermined depth of water has accumulated on the runway surface, the input voltage to comparator 43 exceeds the predetermined level and the output of comparator 43 becomes a voltage which is supplied to the base of an NPN transistor T3. Turn-on of transistor T3 provides a ground path for supply voltage +V through a signal lamp L2, a lamp flashing circuit 45 and the transistor. Signal lamp L2 now flashes on and off providing a second visual indication or warning. It is to be understood that circuitry may be provided by which the illumination of signal lamp L2 would also cause signal lamp L1 to be turned off.

Referring again to FIG. 1-3, a conductivity sensor 47 is shown attached to and embedded in block 3. Sensor 47 has first and second spaced apart electrodes 49 and 51, electrode 51 being mounted to the side of printed circuit board 11 and electrode 49 being positioned parallel with electrode 51. the gap between electrodes 49 and 51 is filled with an insulative material. As shown in FIG. 3, both electrodes, which are preferably strips of stainless steel, are exposed to atmospheric precipitation at top surface 5 of block 3. Further, electrode 51 is connected to electrical ground by a grounding wire 53.

The presence of contaminants, for example salt, in the water accumulating on top surface 5 of block 3 is sensed by conductivity sensor 47. Because the presence of contaminants adversely effects the accuracy with which water depth is sensed using device 1, the response of conductivity sensor 47 is used to preclude water depth indications and thus prevent erroneous ones. Preclusion is effected by producing a voltage whose amplitude is a function of the conductance of sensor 47, comparing the amplitude of that voltage with the amplitude of a reference voltage representative of the conductance of sensor 47 when water containing contaminants is present on surface 5 of block 3 and disabling visual indications when the water contains contaminants.

Referring to FIG. 4, a signal generator 55 supplies an a.c. voltage, via shielded electrical conductor 57, to the ungrounded electrode 49 of conductivity sensor 47; the sensor 47 and resistor R6 constituting a voltage divider. The resulting a.c. voltage developed across conductivity sensor 47 is supplied to the input of an amplifier A2. The a.c. voltage output of amplifier A2 is supplied to the input of a second amplifier A3 whose voltage output is rectified by a half-wave rectifier circuit which includes diodes D1 and D2, resistors R7 and R8 and a capacitor C3. The rectified voltage output of amplifier A3 is a d.c. voltage the amplitude of which is a function of the conductance of sensor 47. This voltage is supplied to one input of a comparator 59. The other input to comparator 59 is a reference voltage whose level is determined by adjusting a potentiometer P5. This reference voltage level, as noted, represents the conductance of sensor 47 when water containing contaminants is present on the surface of sensor 47.

The output of comparator 59 is a voltage which is supplied to the base of an NPN transistor T4. The output voltage of comparator 59, is, for example, greater than 0.75 volts when uncontaminated water is present on conductivity sensor 47. For this condition, transistor T4 is off and the voltage output of amplifier A1, the voltage whose amplitude is representative of water depth, is supplied to the water depth indication circuitry. If, however, the water on the surface is contaminated, the conductance of sensor 47 is such that the output voltage of comparator 59 decrease and, example, falls to 0.25 volts. For this condition, transistor T4 is turned on and the output of amplifier A1 is grounded through transistor T4 thereby precluding any voltage being supplied to the water depth indication circuitry. This condition continues so long as water containing contaminants is present on sensor 47.

It is to be understood that the water depth measuring device and circuitry described herein may be incorporated in the ice and water detector systems of the aforesaid U.S. patents and thus supply additional information, i.e., the depth of water existing at any time on the pathway.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A device for use in determining the depth of water accumulating on the surface of a pathway, such as an airport runway or the like, comprising:
 a block of electrically insulative material adapted to be embedded in a pathway with the top surface of the block being substantially flush with the pathway surface and exposed to atmospheric precipitation;

a sensor comprising first and second capacitors each of which has first and second coplanar spaced apart electrodes, said sensor being positioned within said block with the electrodes of the first cacpacitor positioned adjacent to and inclined with respect to the top surface of the block and the electrodes of the second capacitor being positioned a substantially greater distance from the top surface of the block whereby an accumulation of water on the surface of the block affects the dielectric, capacitance and conductance of the first capacitor without substantially affecting the dielectric, capacitance and conductance of the second;

means for applying respective out-of-phase time-varying electrical signals to the first electrodes of the afore-said capacitors as the input to the sensor;

output means commonly connected to the second electrodes of the aforesaid capacitors for supplying an electrical output signal relative to electrical ground from the sensor; and at least one electrical conductor within the block adapted to be connected to electrical ground with one portion thereof exposed to atmospheric precipitation at the top surface of the block whereby accumulation of water on the surface thereof affects the capacitance and conductance between the output means and electrical ground whereby the amplitude of the electrical output signal of the sensor is a function of the depth of water accumulating on the surface of the pathway.

2. A device as set forth in claim 1 wherein the sensor is so inclined with respect to the top surface of the block that the first electrode of the first capacitor is nearer to the top surface of the block than the second electrode thereof, and the electrodes of the second capacitor are positioned parallel to and substantially in registry with said electrodes of the first capacitor.

3. A device as set forth in claim 2 wherein the electrodes of the first and second capacitors are respectively interdigitated.

4. A device as set forth in claim 3 wherein the electrodes of the first capacitor are positioned on one surface of an electrically insulative substrate and the electrodes of the second capacitor are positioned on the opposite surface thereof.

5. A device as set forth in claim 1 wherein the signal supplying means and the output means include a plurality of shielded electrical conductors, the shielding of said conductors being connected to electrical ground.

6. A device as set forth in claim 1 further including a plurality of electrical conductors within the block each of which is adapted to be connected to electrical ground and have one portion thereof exposed to the atmosphere at the top surface of the block, said exposed portions being laterally spaced from and positioned about the sensor whereby the capacitance and conductance between the output means and electrical ground is so affected when water accumulates on the surface of the block that the amplitude of the electrical output signal varies monotonically with water depth over a preselected range thereof.

7. Apparatus as set forth in claim 6 wherein a portion of the plurality of electrical cnductors are positioned between the first and second electrodes of the first and second capacitors and insulated therefrom.

8. A device as set forth in claim 1 further including means for convertng the electrical ouput signal from the sensor to a d.c. voltage the amplitude of which is representative of the depth of water accumulating on the surface of the pathway.

9. A device as set forth in claim 8 further including means responsive to the d.c. voltage to provide a visual indication of the depth of water accumulating on the surface of the pathway, the water depth indicated being a function of the amplitude of said voltage.

10. A device as set forth in claim 9 wherein the water depth indicator includes at least one signal lamp adapted to be illuminated in response to the amplitude of the voltage exceeding a predetermined level thereby to represent a predetermined water depth.

11. A device as set forth in claim 9 further including a conductivity sensor attached to the block and comprising first and second spaced apart electrodes adapted to be exposed to atmospheric precipitation, one of which electrodes is adapted to be connected to electrical ground.

12. A device as set forth in claim 11 further including means responsive to the conductance of the conductivity sensor when the water accumulating on the surface of the pathway contains contaminants, the presence of which adversely effects the accuracy with which water depth can be sensed, to preclude the water depth indicator from responding to the d.c. voltage thereby to prevent erroneous water depth indications.

13. A device as set forth in claim 12 wherein the means for precluding erroneous water depth indications includes means for producing a voltage the amplitude of which is a function of the conductance of the conductivity sensor, means for comparing the aforesaid voltage amplitude with that of a reference voltage representative of the conductance of the conductivity sensor when contaminant-containing water is present on the conductivity sensor, and means responsive to the comparison means for disabling the visual indication means when the water on the surface of the pathway contains contaminants.

14. A device as set forth in claim 13 which further includes means for applying an a.c. voltage to the ungrounded electrode of the conductivity sensor, and means for rectifying the resulting a.c. voltage across the conductivity sensor to produce a d.c. voltage the amplitude of which is a function of the conductance of the conductivity sensor.

15. A device as set forth in claim 14 wherein the means for disabling the visual indication means comprises a semiconductor device.

* * * * *